(12) United States Patent
Park

(10) Patent No.: US 8,026,564 B2
(45) Date of Patent: Sep. 27, 2011

(54) IMAGE SENSOR AND FABRICATION METHOD THEREOF

(75) Inventor: Jin-Ho Park, Yeongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 41 days.

(21) Appl. No.: 12/634,808

(22) Filed: Dec. 10, 2009

(65) Prior Publication Data
US 2010/0164034 A1    Jul. 1, 2010

(30) Foreign Application Priority Data
Dec. 31, 2008 (KR) .................. 10-2008-0138326

(51) Int. Cl.
*H01L 31/0232* (2006.01)
(52) U.S. Cl. ......... 257/432; 257/E31.127; 257/E21.026; 438/70
(58) Field of Classification Search .......... 257/432, 257/E31.127, E21.026; 438/70
See application file for complete search history.

(56) References Cited

U.S. PATENT DOCUMENTS
2006/0261427 A1* 11/2006 Dillon et al. .................. 257/432
2008/0135899 A1*  6/2008 Park ............................. 257/294

FOREIGN PATENT DOCUMENTS
KR    10-0832710    5/2008
KR    10-0835525    6/2008

* cited by examiner

*Primary Examiner* — Tu-Tu Ho
(74) *Attorney, Agent, or Firm* — Sherr & Vaughn, PLLC

(57) ABSTRACT

An image sensor and a method of fabricating an image sensor. A method of fabricating an image sensor may include forming a plurality of photodiodes on and/or over a semiconductor substrate, a filter array including color filters arranged corresponding to upper parts of photodiodes, a plurality of hydrophilic lenses arranged over a filter array spaced apart from one another, and/or a plurality of hydrophobic lenses arranged over a filter array between hydrophilic lenses. A curvature of a lens may be substantially equal in a horizontal, vertical and/or diagonal direction.

18 Claims, 3 Drawing Sheets

IMAGE SENSOR AND FABRICATION METHOD THEREOF

The present application claims priority under 35 U.S.C. 119 to Korean Patent Application No. 10-2008-0138326 (filed on Dec. 31, 2008) which is hereby incorporated by reference in its entirety.

BACKGROUND

Embodiments relate semiconductor technology. Some embodiments relate to an image sensor and a method of fabricating an image sensor.

Figure 1A:
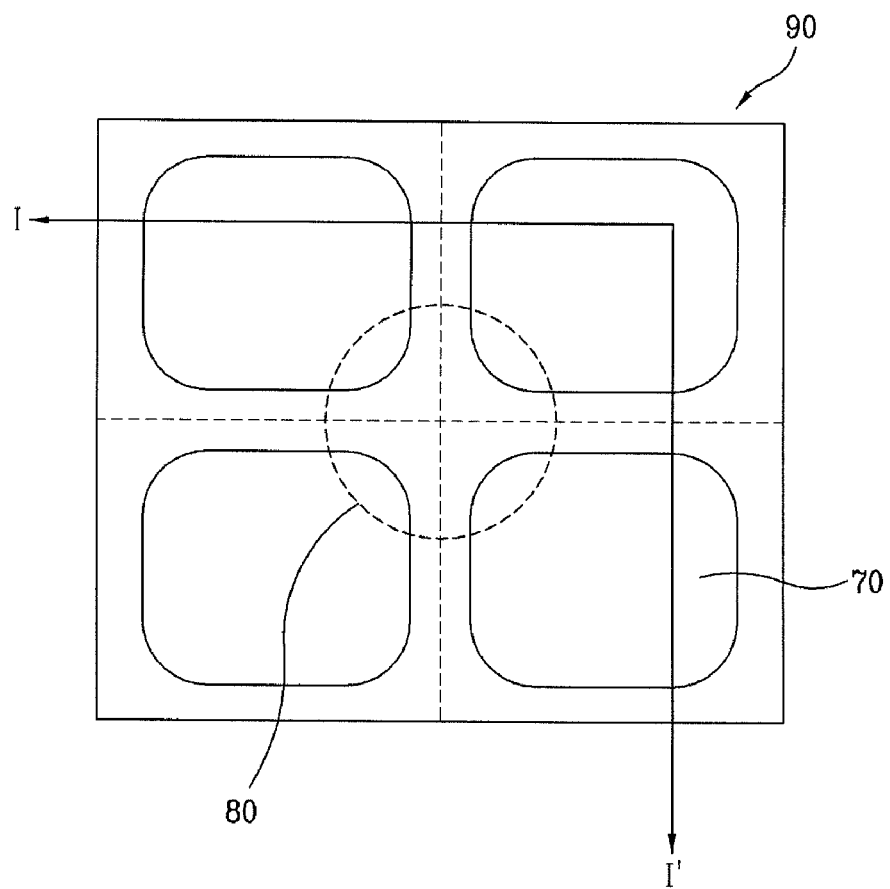

An image sensor may include a semiconductor device which may convert an optical image into an electrical signal. An image sensor may include charge coupled devices (CCDs) and/or complementary metal oxide silicon (CMOS) devices. An image sensor may include a light receiving region having a photodiode which may sense light, and/or a logic region which may process sensed light into an electrical signal data. Efforts may have been made to maximize optical sensitivity. Example FIG. 1A is a plan view illustrating a microlens of a CMOS image sensor. Example FIG. 1B is a sectional view of FIG. 1A cut along a line I-I'.

Figure 1B:
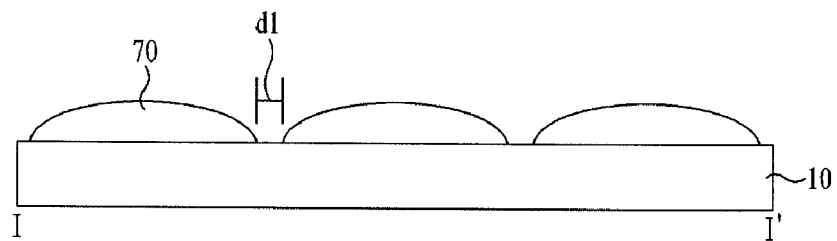

Referring to FIG. 1A and FIG. 1B, a light receiving region including a photodiode is schematically shown, excluding a logic region. An image sensor may include semiconductor substrate 10. An image sensor may include a plurality of microlenses 70 arranged corresponding to red (R), blue (B) and/or green (G) color filters formed on and/or over semiconductor substrate 10. An image sensor may include a plurality of photodiodes disposed on and/or over an active region of semiconductor substrate 10, an interlayer dielectric formed on and/or over an entire surface of the semiconductor substrate 10 which may include metal lines, a dielectric film formed on and/or over an interlayer dielectric, a filter array including R, B and/or G color filters arranged corresponding to photodiodes on and/or over a dielectric film, and/or a planarization layer formed on and/or over a filter array.

A 0.18 μm image sensor may employ single microlenses. However, as an image sensor may be developed to be smaller than 0.13 μm, sensitivity may be minimized owing to gaps generated among single microlenses. Dual microlense technology may be introduced. Dual microlenses generate substantially no gaps and/or may be capable of compensating for minimized sensitivity by between approximately 10% and 20% relative to single microlens. Dual microlenses may be capable of transmitting data of relatively more light to photodiodes relative to single microlens, thereby maximizing sensitivity.

Dual microlenses may exhibit problems, for example of a corner gap and/or a lens curvature. Since dual microlenses may be a type of planner-type microlens, curvatures may be substantially same in a vertical direction and in a horizontal direction of dual microlenses, but a curvature in a diagonal direction may be different. A single microlens may also include such a difference in curvature. A curvature difference may affect light condensing efficiency. Also, light may interfere with a corresponding photodiode and/or neighboring photodiodes. Noise and/or distortion may be maximized.

Accordingly, there is a need of an image sensor and a method of fabricating an image sensor which may include a microlens in which curvatures are substantially equal in a horizontal, vertical and/or diagonal directions.

SUMMARY

Embodiments relate to an image sensor and a method of fabricating an image sensor. According to embodiments, an image sensor and a method of fabricating an image sensor may include a microlens in which curvatures are all substantially equal in horizontal, vertical and/or diagonal directions. In embodiments, an image sensor and a method of fabricating an image sensor may include a lens which may be designed to have substantially equal curvatures throughout. In embodiments, sensitivity may be maximized.

According to embodiments, an image sensor may include a plurality of photodiodes formed on and/or over a semiconductor substrate. In embodiments, an image sensor may include a filter array which may include color filters arranged corresponding to upper parts of photodiodes. In embodiments, an image sensor may include a plurality of hydrophilic lenses, for example arranged on and/or over a filter array substantially separate from one another. In embodiments, an image sensor may include a plurality of hydrophobic lenses arranged on and/or over a filter array, for example at positions between neighboring hydrophilic lenses.

According to embodiments, a method of fabricating an image sensor may include forming a plurality of photodiodes on and/or over a semiconductor substrate. In embodiments, a method of fabricating an image sensor may include forming a filter array which may include color filters corresponding to upper parts of photodiodes. In embodiments, a method of fabricating an image sensor may include forming a plurality of hydrophilic lenses, which may be substantially separate from one another on and/or over a filter array. In embodiments, a method of fabricating an image sensor may include forming a plurality of hydrophobic lenses on and/or over a filter array, for example at positions between neighboring hydrophilic lenses.

According to embodiments, a method of fabricating an image sensor may include forming a plurality of photodiodes on and/or over a semiconductor substrate. In embodiments, a method of fabricating an image sensor may include forming a filter array which may include color filters corresponding to upper parts of photodiodes. In embodiments, a method of fabricating an image sensor may include forming a first hydrophobic photoresist on and/or over a filter array.

According to embodiments, a method of fabricating an image sensor may include forming a mask pattern having a checkerboard form on and/or over a filter array. In embodiments, a method of fabricating an image sensor may include performing etching using a mask pattern. In embodiments, a method of fabricating an image sensor may include forming a plurality of hydrophilic lenses substantially separate from one another in a checkerboard form. In embodiments, a method of fabricating an image sensor may include forming a plurality of hydrophobic lenses on and/or over relatively thin photoresists, for example photoresist remaining with a relatively thin thickness on and/or over a filter array between substantially separate hydrophilic lenses.

DRAWINGS

Example FIG. 1A is a plan view illustrating a microlens of a complimentary metal oxide silicon image sensor.

Example FIG. 1B is a sectional view of FIG. 1A cut along a line I-I'.

Figure 2A:
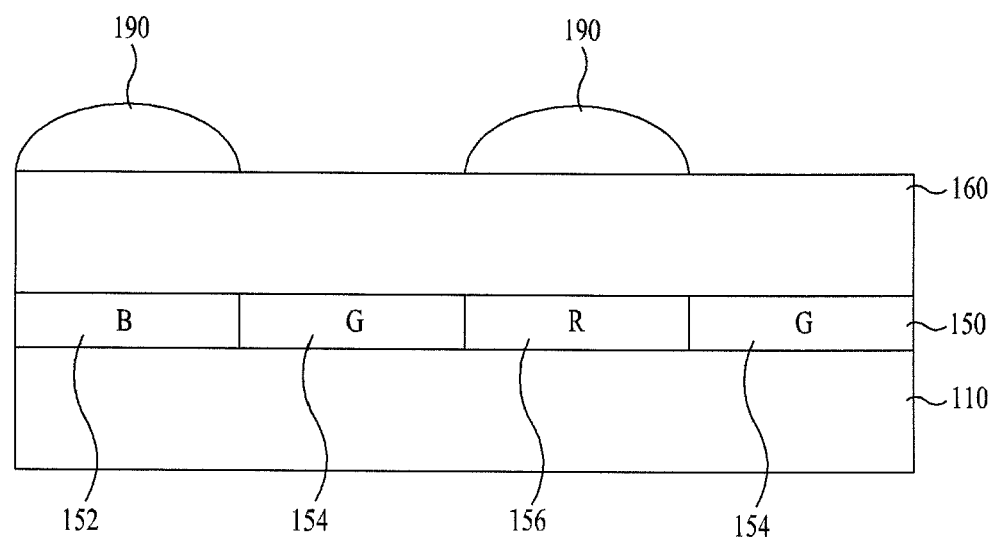
Figure 2B:
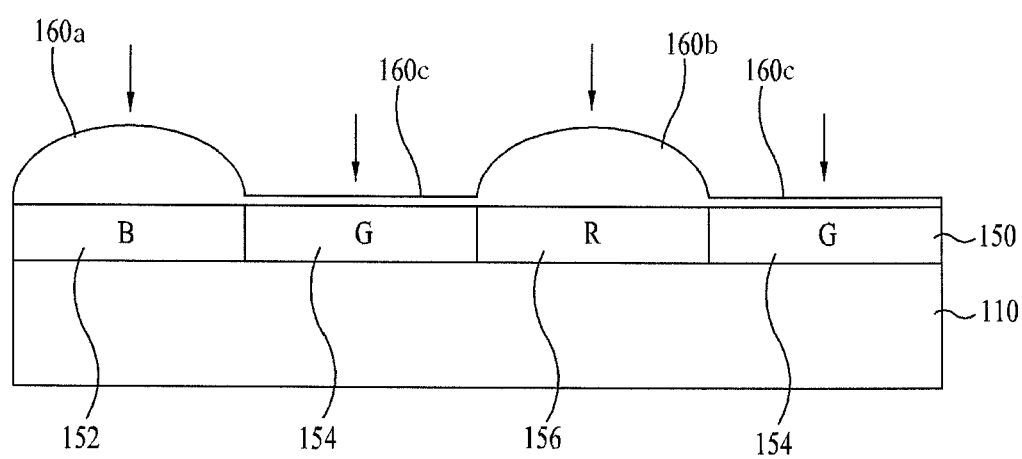
Figure 2C:
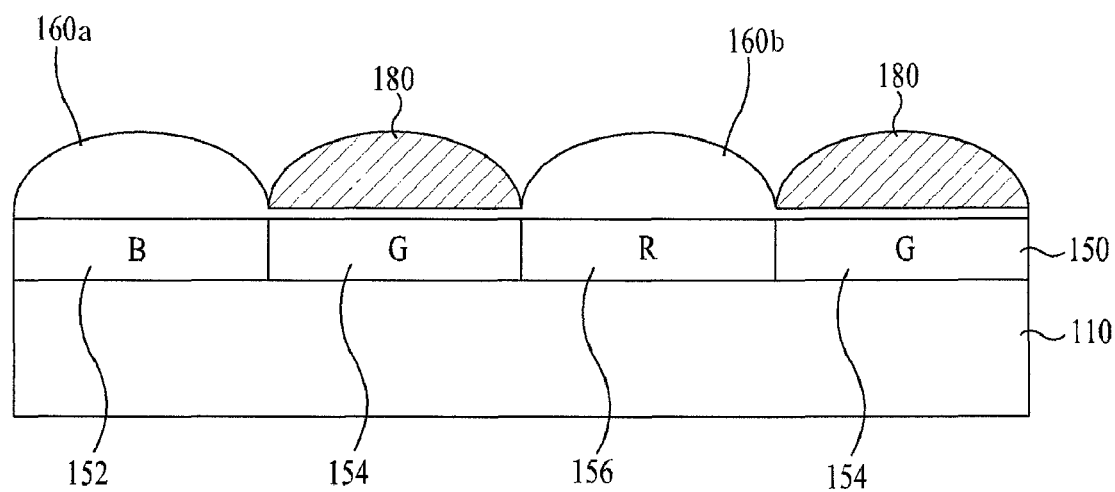

Example FIG. 2A to FIG. 2C are sectional views illustrating a method of fabricating an image sensor in accordance with embodiments.

DESCRIPTION

Embodiments relate to an image sensor and a method of fabricating an image sensor. According to embodiments, a microlens may be formed using a photoresist. In embodiments, a pincushion microlens which may be used in a pincushion manner may be formed. Referring to example FIG. 2A to FIG. 2C, sectional views illustrate a method of fabricating an image sensor in accordance with embodiments.

According to embodiments, a plurality of photodiodes may be formed on and/or over semiconductor substrate 110. In embodiments, photodiodes may be disposed on and/or over an active region of semiconductor substrate 110. In embodiments, semiconductor substrate 110 including photodiodes, an interlayer dielectric including metal lines and/or a dielectric layer may be sequentially formed.

Referring to FIG. 2A, filter array 150 may include a plurality of color filters 152, 154 and/or 156 formed on and/or over an upper part of a dielectric layer which may correspond to photodiodes. According to embodiments, photoresist 160 may be formed on and/or over filter array 150. In embodiments, mask pattern 190 may be formed on and/or over photoresist 160. In embodiments, filter array 150 may include blue (B) color filter 152, green (G) color filter 154, and/or red (R) color filter 156.

According to embodiments, photoresist 160 may be used as a seed to form a hydrophilic microlens. In embodiments, photoresist 160 may be a planarization layer for an upper surface of filter array 150. In embodiments, a dielectric layer to planarize an upper surface of filter array 150 may not be dedicatedly required. In embodiments, photoresist 160 may be vapor-deposited on and/or over filter array 150. In embodiments, photoresist 160 may include a thickness between approximately 3000 Å and 4000 Å.

Referring to FIG. 2, reactive ion etching (RIE) may be performed using mask pattern 190 formed on and/or over photoresist 160. According to embodiments, a plurality of hydrophilic microlenses 160*a* and/or 160*b* may be formed on and/or over filter array 150 through RIE, for example as illustrated in FIG. 2B. In embodiments, microlenses 160*a* and/or 160*b* may be formed substantially separately from each other. In embodiments, microlens 160*a* may be formed on and/or over B color filter 152, and/or microlens 160*b* may be formed on and/or over R color filter 156.

According to embodiments, a plurality of microlenses 160*a* and/or 160*b* may be formed on and/or over filter array 150. In embodiments, mask pattern 190 formed on and/or over photoresist 160 may include a shape of lenses substantially separated from each other. In embodiments, mask pattern 190 may be formed at an upper part of photoresist 160 corresponding to B color filter 152 and/or at an upper part of photoresist 160 corresponding to R color filter 156. In embodiments, mask pattern 190 may include a checkerboard form.

According to embodiments, RIE may be performed using mask pattern 190. In embodiments, a lens pattern may be formed at a lower part of mask pattern 190. In embodiments, a lens pattern may correspond to a plurality of microlenses 160*a* and/or 160*b*. In embodiments, a plurality of microlenses 160*a* and/or 160*b* may be formed, for example by modifying a surface of a lens pattern which may become hydrophilic by RIE. In embodiments, photoresist 160 may include hydrophobic properties but a surface thereof may become hydrophilic through RIE. In embodiments, hydrophilic microlenses 160*a* and/or 160*b* may be formed.

According to embodiments, mask pattern 190 may be substantially totally removed through RIE. In embodiments, mask pattern 190 may include a shape of substantially separated lenses. In embodiments, a plurality of microlenses 160*a* and/or 160*b* may be substantially separate from each other, and/or may be formed at a lower part of where mask pattern 190 may have existed. In embodiments, mask pattern 190 having a checkerboard form may be used to form microlenses 160*a* and/or 160*b* substantially separately. In embodiments, RIE may be performed using checkerboard mask pattern 190. In embodiments, hydrophilic microlenses 160*a* and/or 160*b* may be formed including a checkerboard form.

According to embodiments, a lens pattern for microlenses 160*a* and/or 160*b* may be formed at a lower part of mask pattern 190 by RIE using mask pattern 190. In embodiments, photoresist 160 may be vapor-deposited on and/or over filter array 150, and/or may remain having a predetermined thickness at positions between neighboring microlenses 160*a* and 160*b*, for example at an upper part of G color filter 154 and/or an upper part of another B color filter on and/or over which microlenses 160*a* and/or 160*b* may not be formed. In embodiments, left portions of photoresist 160 may reference relatively thin photoresists 160*c*. In embodiments, relatively thin photoresists 160*c* may be formed including a thickness at approximately 400 Å and/or may be used for planarization on and/or over filter array 150.

Referring to FIG. 2C, a plurality of hydrophobic microlenses 180 may be formed at positions between neighboring hydrophilic microlenses 160*a* and/or 160*b* on and/or over filter array 150. In embodiments, hydrophobic microlenses 180 may be formed on and/or over relatively thin photoresists 160*c* left including a predetermined thickness on and/or over filter array 150 between neighboring hydrophilic microlenses 160*a* and/or 160*b*. In embodiments, a plurality of hydrophobic microlenses 180 may be formed. In embodiments, a photoresist may be vapor-deposited on and/or over relatively thin photoresists 160*c*, for example at positions corresponding to hydrophilic microlenses 160*a* and/or 160*b* on and/or over an upper part of filter array 150. In embodiments, a vapor-deposited photoresist may be reflowed and/or cured, such that a plurality of hydrophobic microlenses 180 may be formed. In embodiments, hydrophilic microlenses 160*a* and/or 160*b*, and/or hydrophobic microlenses 180 may be formed having substantially the same height.

According to embodiments, an image sensor in accordance with embodiments may be a complementary metal oxide silicon (CMOS) image sensor. In embodiments, a CMOS image sensor in accordance with embodiments may be described with reference to FIG. 2C. In embodiments, a plurality of photodiodes may be formed on and/or over semiconductor substrate 110. In embodiments, photodiodes may be formed on and/or over an active region of semiconductor substrate 110. In embodiments, an interlayer dielectric including metal lines and/or a dielectric layer disposed on and/or over an upper part of an interlayer dielectric may be formed on and/or over semiconductor substrate 110 including photodiodes.

According to embodiments, filter array 150 may include a plurality of color filters, for example B color filter 152, G color filter 154 and/or R color filter 156, which may be formed at an upper part of an interlayer dielectric and/or a dielectric layer corresponding to photodiodes. In embodiments, a plurality of hydrophilic microlenses 160*a* and/or 160*b* may be formed on and/or over filter array 150, which may be substantially separated from each other. In embodiments, microlens 160*a* may be disposed on and/or over B color filter 152, and/or microlens 160*b* may be disposed on and/or over R color filter 156.

According to embodiments, a plurality of hydrophobic microlenses 180 may be formed on and/or over filter array 150 at positions between a plurality of hydrophilic microlenses 160*a* and/or 160*b* which may be substantially separately arranged from one another. In embodiments, hydrophilic microlenses 160a and/or 160b may be alternately arranged having hydrophobic microlenses 180 therebetween, such that microlenses having substantially the same properties may not adjoin. In embodiments, microlenses 160a, 160b and/or 180 may be first formed using a hydrophobic photoresist. In embodiments, hydrophilic microlenses 160a and/or 160b may be modified to have hydrophilic surfaces through RIE. In embodiments, a plurality of hydrophilic microlenses 160a and/or 160b may be formed by etching a photoresist through RIE which may use a mask pattern having a shape of substantially separated lenses. In embodiments, hydrophobic surfaces may be turned into hydrophilic surfaces through RIE. In embodiments, hydrophobic microlenses 180 may be formed, for example by forming a photoresist between hydrophilic microlenses 160a and/or 160b, reflowing and/or curing a photoresist.

According to embodiments, some microlenses may be surface-modified to include hydrophilic surfaces through etching although microlenses may be formed using photoresist. In embodiments, a margin with respect to gaps among microlenses may be relatively increased. In embodiments, a curvature of a lens may be substantially equal in a horizontal, vertical and/or in diagonal directions. In embodiments, condensing efficiency may be maximized. In embodiments, a light may not substantially interfere with other photodiodes neighboring corresponding photodiodes. In embodiments, noise and/or distortion may be minimized In embodiments, sensitivity may be maximized by transmitting relatively more light to photodiodes.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a plurality of photodiodes over a semiconductor substrate;
   a filter array comprising color filters over corresponding upper parts of said plurality of photodiodes;
   a plurality of hydrophilic lenses over said filter array spaced apart from one another; and
   a plurality of hydrophobic lenses over said filter array between said hydrophilic lenses,
   wherein said plurality of hydrophilic lenses and said plurality of hydrophobic lenses are formed from the same material.

2. The apparatus of claim 1, wherein the material comprises photoresist.

3. The apparatus of claim 2, wherein said plurality of hydrophilic lenses are spaced apart by etching the photoresist using a mask pattern having a checkerboard form.

4. The apparatus of claim 3, wherein said photoresist is surface-modified to comprise a hydrophilic surface by the etching.

5. The apparatus of claim 2, wherein said plurality of hydrophobic lenses are formed over said filter array by reflowing and curing the photoresist.

6. The apparatus of claim 1, wherein said plurality of hydrophilic lenses and said plurality of hydrophobic lenses are substantially the same height.

7. The apparatus of claim 1, comprising a complimentary metal oxide image sensor.

8. A method comprising:
   forming a plurality of photodiodes over a semiconductor substrate;
   forming a filter array comprising color filters over corresponding upper parts of said plurality of photodiodes;
   forming a plurality of hydrophilic lenses over said filter array spaced apart from one another; and
   forming a plurality of hydrophobic lenses over said filter array between said hydrophilic lenses,
   wherein forming said plurality of hydrophilic lenses comprises:
   vapor-depositing a photoresist over said filter array;
   forming a mask pattern over the photoresist in the form of separated lenses; and
   forming a lens pattern at a lower part of said mask pattern by etching using said mask pattern such that said lens pattern is surface-modified to comprise a hydrophilic surface.

9. The method of claim 8, wherein forming said lens pattern comprises forming relatively thin photoresists such that the photoresist vapor-deposited over said filter array remains, and comprises a predetermined thickness between said plurality of hydrophilic lenses which are spaced apart.

10. The method of claim 9, wherein said plurality of hydrophobic lenses are formed over said relatively thin photoresists.

11. The method of claim 8, wherein said etching comprises reactive ion etching configured to surface-modify said photoresist to comprise hydrophilic properties.

12. The method of claim 8, wherein forming said plurality of hydrophobic lenses comprises:
    vapor-depositing a photoresist over said filter array between said plurality of hydrophilic lenses which are spaced apart; and
    reflowing and curing said vapor-deposited photoresist.

13. The method of claim 8, wherein said plurality of hydrophilic lenses and said plurality of hydrophobic lenses are substantially the same height.

14. The method of claim 8, comprising forming a complimentary metal oxide image sensor.

15. A method comprising:
    forming a plurality of photodiodes over a semiconductor substrate;
    forming a filter array comprising color filters over corresponding upper parts of said plurality of photodiodes;
    forming a first hydrophobic photoresist over said filter array;
    forming a mask pattern having a checkerboard form over said filter array;
    performing etching using said mask pattern to form a plurality of hydrophilic lenses spaced apart from one another having said checkerboard form; and
    forming a plurality of hydrophobic lenses over relatively thin photoresists formed between said plurality of hydrophilic lenses.

16. The method of claim 15, wherein the etching comprises reactive ion etching to surface-modify said first hydrophobic photoresist to comprise hydrophilic properties.

17. The method of claim 15, wherein forming said plurality of hydrophobic lenses comprises:
    vapor-depositing a second hydrophobic photoresist over said relatively thin photoresists; and
    reflowing and curing said vapor-deposited second photoresist.

18. The method of claim 15, wherein said plurality of hydrophilic lenses and said plurality of hydrophobic lenses are substantially the same height.

* * * * *